United States Patent
Beroset et al.

(10) Patent No.: US 6,618,684 B1
(45) Date of Patent: Sep. 9, 2003

(54) SYSTEM AND METHOD FOR DIGITALLY COMPENSATING FREQUENCY AND TEMPERATURE INDUCED ERRORS IN AMPLITUDE AND PHASE SHIFT IN CURRENT SENSING OF ELECTRONIC ENERGY METERS

(75) Inventors: Edward John Beroset, Chapel Hill, NC (US); Konstantin Zh. Lobastov, Raleigh, NC (US); Richard William Blasco, Auburn, CA (US); Rodney C. Hemminger, Raleigh, NC (US); Peter W. Heuell, Raleigh, NC (US); Stig Leira, Baerums Verk (NO); Valentin Suta, Raleigh, NC (US); Scott Turner Holdsclaw, Raleigh, NC (US)

(73) Assignee: Elster Electricity, LLC, Horsham, PA (US)

( * ) Notice: Subject to any disclaimer, the term of this patent is extended or adjusted under 35 U.S.C. 154(b) by 0 days.

(21) Appl. No.: 09/491,379

(22) Filed: Jan. 26, 2000

(51) Int. Cl.[7] .......................... G01K 15/00; G01K 19/00
(52) U.S. Cl. ......................................................... 702/99
(58) Field of Search .............................. 702/99, 57, 61, 702/60, 130–132; 324/105, 76.11, 76.77, 76.82, 142, 140 R, 141; 340/870.02, 870.17, 870.25–870.26; 374/170, 171, 101, 102, 109

(56) References Cited

U.S. PATENT DOCUMENTS

| | | | |
|---|---|---|---|
| 4,980,691 A | * 12/1990 | Rigg et al. .................. 342/372 |
| 5,017,860 A | 5/1991 | Germer et al. |
| 5,181,026 A | * 1/1993 | Granville ................ 324/870.28 |
| 5,315,235 A | * 5/1994 | Atherton et al. ............. 324/116 |
| 5,467,012 A | 11/1995 | Nystrom |
| 5,485,393 A | 1/1996 | Bradford |
| 5,532,582 A | * 7/1996 | Egami ......................... 324/130 |
| 5,736,847 A | * 4/1998 | Van Doorn et al. ......... 324/142 |
| 5,764,523 A | * 6/1998 | Yoshinaga et al. ............. 702/61 |
| 5,892,408 A | * 4/1999 | Binder ......................... 331/44 |
| 5,903,145 A | 5/1999 | Hemminger et al. |
| 6,067,029 A | * 5/2000 | Durston ................. 340/870.03 |
| 6,160,460 A | * 12/2000 | Hicks et al. ................ 333/17.1 |
| 6,163,210 A | * 12/2000 | Fukuchi ....................... 330/52 |
| 6,311,136 B1 | * 10/2001 | Henry et al. .................. 702/45 |
| 6,342,798 B1 | * 1/2002 | Yoshida ....................... 327/156 |
| 6,377,037 B1 | * 4/2002 | Burns et al. ................. 324/142 |

* cited by examiner

*Primary Examiner*—John Barlow
*Assistant Examiner*—Demetrius Pretlow
(74) *Attorney, Agent, or Firm*—Woodcock Washburn LLP

(57) ABSTRACT

The phase shift in an electronic energy meter is compensated for by obtaining temperature and frequency readings in the meter and using these readings in a digital signal processor (DSP) residing within the electronic energy meter. The frequency and temperature compensation is performed to each phase calibration and the result is stored in the DSP. To reduce the possible influence of noise in the system, the compensated DSP values are filtered to provide a smoothing of the data.

36 Claims, 5 Drawing Sheets

SYSTEM AND METHOD FOR DIGITALLY COMPENSATING FREQUENCY AND TEMPERATURE INDUCED ERRORS IN AMPLITUDE AND PHASE SHIFT IN CURRENT SENSING OF ELECTRONIC ENERGY METERS

FIELD OF THE INVENTION

The present invention relates in general to the field of utility meters. More particularly, the present invention relates to systems and methods for temperature-dependent and frequency-dependent phase, shift compensation of low permeability current sensors in electronic energy meters.

BACKGROUND OF THE INVENTION

Programmable electronic energy meters are rapidly replacing electro-mechanical meters due to the enhanced functionality achieved using programmable logic integrated into solid-state electronic meters. Some of these meters can be used to meter various different electrical services without hardware modification. For example, meters having a voltage operating range between about 98 Vrms and about 526 Vrms are capable of operation with either 120 V or 480 V services. U.S. Pat. No. 5,457,621, dated Oct. 10, 1995, entitled SWITCHING POWER SUPPLY HAVING VOLTAGE BLOCKING CLAMP, assigned to ABB Automation Inc. discloses examples of such meters. In addition, some meters are constructed for use with any 3-wire or any 4-wire service, also disclosed in U.S. Pat. No. 5,457,621.

Electronic energy meters are instruments that measure the flow of energy. Electronic energy meters typically do this by sensing the current and voltage. The power is derived from the sensed currents and voltages, and energy is defined as the measurement of power over time.

Voltage and current signals are primarily sinusoidal. Voltage and current sensors are used in a meter to convert the primary signals to a signal that can be processed. One type of current sensor commonly used in electronic meters is a current transformer. In an ideal current transformer the secondary current is equal to the primary current divided by the turns ratio. In practice, current transformers are non-ideal, having losses in the burden, the copper wire in the windings, and the core itself. These characteristics result in amplitude and phase deviations as compared to an ideal current transformer.

The current transformer's phase shift is predominately determined by the inductance, the winding resistance, and the burden resistance. The current transformer essentially behaves as a high pass filter with the inductance and the sum of the winding and burden resistances setting the break frequency. In order to reduce this phase shift error, electronic energy meters typically use core materials having a very high relative permeability to obtain a high inductance. It is not uncommon for a core's relative permeability to be as high as 100,000 in order to achieve phase shifts of less than 0.1 degrees.

In some markets, it is desired for meters in direct-connected applications to be accurate even in the presence of significant half-wave rectified currents. An example of this can be found in the IEC-1036 requirements. As a half-wave rectified waveform has significant DC content, it is necessary for current sensors in such meters to be sufficiently immune to DC in the primary current. High permeability cores become saturated quickly in the presence of DC current and hence have limited application with this requirement.

For current transformers, immunity from DC current can be improved by increasing core area, by selecting alternative core materials that have a higher saturation level, and by lowering the relative permeability of the core material. In general, increasing the core geometry is limited due to cost and space requirements. Examples of alternative core materials are nanocrystalline and amorphous materials. These materials have recently become economically feasible and reliable. Although such materials improve the DC immunity it is still necessary to lower the overall relative permeability to provide an appropriate solution.

This DC immunity comes at a cost, however. As the permeability and inductance of the current sensors are reduced, the phase shift error is greater. With phase shifts greater than about 0.5 degrees, changes in the phase shift with operating conditions can no longer be ignored. The current transformer's inductance is a function of the line frequency and the winding resistance is a function of temperature (as a result of the copper wire). Thus, the phase shift is a function of temperature and frequency, and because the phase shift in low permeability materials is larger, they are more sensitive to temperature and frequency. Thus, a need exists to compensate for the frequency and temperature induced errors in the phase and amplitude output of the current sensors in an electronic energy meter.

SUMMARY OF THE INVENTION

The present invention is directed to a system and method for compensating for temperature-induced and/or line frequency-induced changes in the phase shift of the current sensors in an energy meter. To compensate for temperature-induced phase shift, a temperature reading from a temperature sensor within the energy meter is obtained. The temperature reading is converted to a digital signal. The digital signal is then converted to a degrees of phase shift value. A processor in the meter adjusts its output based on the degrees of phase shift value.

To compensate for line frequency-induced phase shift, a line frequency of the signals is obtained. The line frequency is converted to an engineering units value. The engineering units value is then converted to a degrees of phase shift value. A processor in the meter adjusts its output based on the degrees of phase shift value.

To compensate for both temperature-induced phase shift and line frequency-induced phase shift, the respective degrees of phase shift values are combined to obtain a total degrees of phase shift value. The processor then adjusts its output based on the total degrees of phase shift value.

According to aspects of the invention, converting a digital signal or an engineering units value to a degrees of phase shift value comprises solving an associated linear equation for phase shift based on temperature or line frequency. The linear equation is determined by an approximation of the theoretical and experimental data.

According to further aspects of the invention, the output of the processor is delayed by an amount equal to the degrees of phase shift value, or by a time shift determined based on the degrees of phase shift value.

BRIEF DESCRIPTION OF THE DRAWINGS

The present invention will be better understood, and its numerous objects and advantages will become apparent, by reference to the following detailed description of the invention when taken in conjunction with the following drawings, in which.

DESCRIPTION OF EXEMPLARY EMBODIMENTS AND BEST MODE

The present invention dynamically corrects for phase shift in an electronic energy meter by obtaining temperature and frequency readings in the meter and using these readings in a digital signal processor (DSP) residing within the electronic energy meter. The temperature and frequency readings are used to compensate for temperature and frequency-dependent phase shifts. The frequency and temperature compensation adjusts each phase's calibration values and the result is stored in the DSP. To reduce the possible influence of noise in the system, the compensation values are averaged to provide a smoothing of the data.

Figure 1:
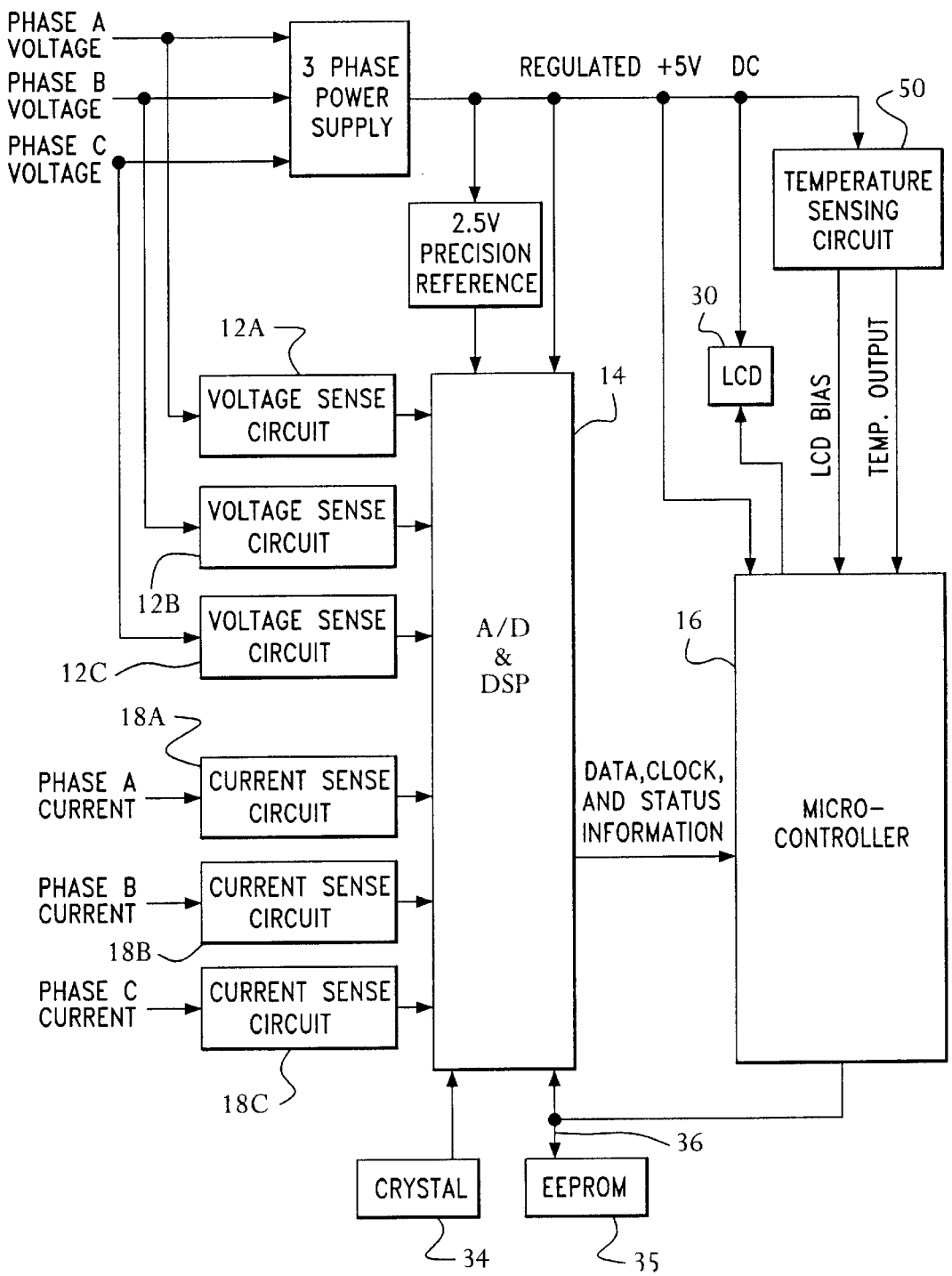
FIG. 1 is a block diagram showing the functional components of an exemplary meter and their interfaces in accordance with the present invention.

FIG. 1 is a block diagram showing the functional components of an exemplary meter and their interfaces in accordance with the present invention. As shown in FIG. 1, a meter for metering three-phase or single phase electrical energy preferably includes a digital LCD type display 30, a meter integrated circuit (IC) 14 which preferably comprises A/D converters and a programmable DSP, and a microcontroller 16. The microcontroller also comprises an A/D converter.

Analog voltage and current signals propagating over power transmission lines between the power generator of the electrical service provider and the users of the electrical energy are sensed by voltage sensors 12A, 12B, 12C and current sensor circuits 18A, 18B, 18C, respectively. The outputs of the voltage sensors 12A–12C and current sensor circuits 18A–18C, or sensed voltage and current signals, are provided as inputs to meter IC 14. The A/D converters in the meter IC 14 convert the sensed voltage and current signals into digital representations of the analog voltage and current signals. In a preferred embodiment, the A/D conversion is carried out as described in U.S. Pat. No. 5,544,089 dated Aug. 6, 1996, and entitled PROGRAMMABLE ELECTRICAL METER USING MULTIPLEXED ANALOG-TO-DIGITAL CONVERTERS, assigned to ABB Automation Inc. The digital voltage and current signals are then input to the programmable DSP in the meter IC 14 for generating pulsed signals representing various power measurements, e.g., Watts, VAs, or VARs. These pulsed signals may be processed by the microcontroller 16 to perform revenue metering functions for billing purposes.

The exemplary microcontroller 16 performs numerous revenue metering functions as well as instrumentation functions. Instrumentation functions, in contrast to revenue functions, are intended to assist a technician in evaluating a service based on near-instantaneous conditions at the meter. Instrumentation measurements may include system parameters such as frequency, Watts, VARs, and VAs, and per phase information such as voltage, current, phase angles, power factor, current to voltage angle, kWatts, kVARs, kVA, and harmonic distortion related parameters.

The microcontroller 16 preferably interfaces with the meter IC 14 and one or more memory devices through an IIC bus 36. An EEPROM 35 is provided to store revenue data as well as programs and program data. Upon a power up (either after an installation or a power failure) or a data altering communication, for example, selected programs and program data stored in the EEPROM 35 may be downloaded to program RAM and data RAM associated with the DSP in the meter IC 14. The DSP under the control of the microcontroller 16 processes the digital voltage and current signals in accordance with the downloaded programs and data stored in the respective program and data RAM.

To perform instrumentation functions, the microcontroller 16 may use voltage and current, real and apparent energy with lead/lag indication, frequency, and relative voltage or current phase angle information from the DSP. The meter IC 14 monitors the digital phase voltage signals and phase current signals over two line cycles (at about 50 or 60 Hz, two line cycle measurements are defined herein as RMS measurements even though they are near instantaneous) and then computes the RMS voltage and current values, real and apparent energies with lead/lag indication, average frequency, and relative voltage and current phase angle information. It should be understood that the number of line cycles is preferably programmable and a different number of line cycles, such as four line cycles for example, may be used for designated measurements. The RMS parameters are computed for a single phase at a time and stored in the data RAM in meter IC 14. The microcontroller 16 polls for data in these registers via the IIC bus 36 for requested instrumentation measurements. Because the instrumentation measurements are near-instantaneous, no values are stored other than the ones presently being requested.

Figure 2A:
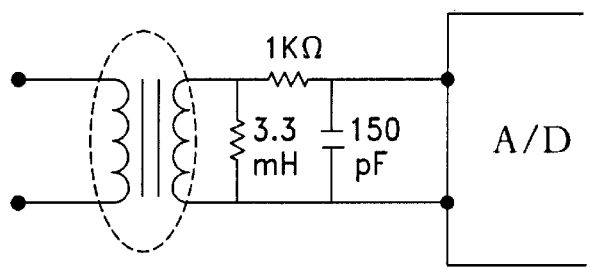
FIG. 2A is a schematic diagram showing an exemplary current sensor circuit in accordance with the present invention.
Figure 2B:
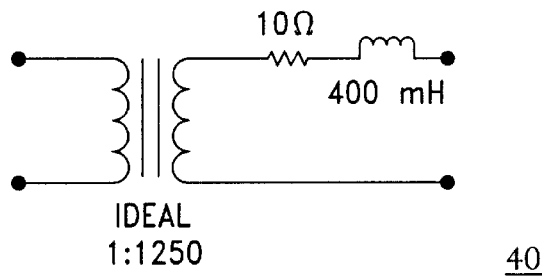
FIG. 2B is a schematic diagram of an equivalent circuit of the current transformer of FIG. 2A.

The current sensor circuits 18A, 18B, 18C employ current transformers 40. FIG. 2A shows a schematic diagram of an exemplary current sensor circuit, and FIG. 2B shows the equivalent circuit of the current transformers as a combination of ideal parts. Each current transformer preferably has a low permeability core (e.g., a permeability less than about 10,000, and preferably between about 1000 and 10,000). These cores may also be constructed with nanocrystalline or amorphous material.

Figure 3:
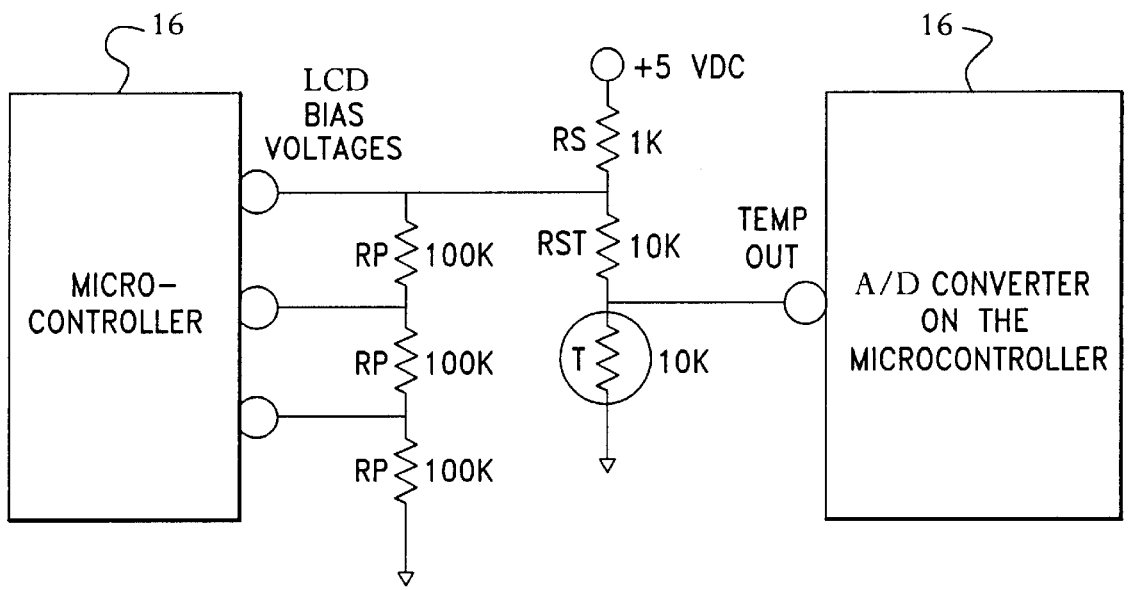
FIG. 3 is a schematic diagram of an exemplary temperature sensor in accordance with the present invention.

A temperature sensor 50 is disposed within the meter, such as on the current sensor, though the temperature sensor could be disposed elsewhere, such as directly on the printed circuit board (PCB). A schematic diagram of an exemplary temperature sensor 50 is shown in FIG. 3. The analog output voltage VT from the temperature sensor 50 is electrically connected to the A/D converter of the microcontroller 16 and is sensed in order to determine the temperature of the meter. Exemplary values for the resistors are RS=1000 $\Omega$, each RP=100 k$\Omega$, RST=10 k$\Omega$, and for the thermistor T=10 k$\Omega$.

For the exemplary temperature sensor, the output voltage VT is non-linear. The following linear equations (1), (2), and (3) are good approximations and are used to determine the temperature T (in ° C.) based on the voltage VT:

$$VT = -0.048/2 \times T + 3.927; \text{ for } T < -15° \text{ C.} \tag{1}$$

$$VT=-0.048 \times T+3.565; \text{ for } T<-15° \text{ C.} \leq 45° \text{ C.} \quad (2)$$

$$VT=-0.048/2 \times T+2.453; \text{ for } T>45° \text{ C.} \quad (3)$$

These linear equations are preferred as they require less computational overhead. If the temperature sensor is located on the PCB, it is assumed that the PCB temperature reasonably corresponds to the current transformers temperature. It is noted that any conventional temperature sensor can be used in accordance with the present invention and that the temperature in ° C. can be obtained, if not directly, then from the voltage or another measured value based on the manufacturer's data sheets.

Exemplary equations (4) and (5) describe the relations of amplitude and phase shift to temperature and frequency. Equations (4) and (5) are based on the equivalent ideal circuit as shown in FIG. 2B.

$$F(T) = \left(\frac{R_W + R_B}{2\pi f L}\right) \quad (4)$$

$$\phi(T) = \tan^{-1}\left(\frac{R_W + R_B}{2\pi f L}\right) \quad (5)$$

where:

F(T) is the error amplitude of the voltage measured at the burden of the current sensor, φ(T) is the phase shift of the secondary burden voltage relative to the primary current, $R_B$ is the burden resistance, $R_W$ is the resistance of the winding, f is the frequency, and L is the inductance of the current transformer.

Thus, for phase shift compensation, the role of the frequency component can be described, as shown in Equation (5). In the numerator, $R_B$ in the exemplary embodiment is approximately 3.3 Ω and is relatively immune to temperature variation. As is well known in the art, the $R_W$ term is a function of the copper winding and varies with temperature. For example, in the exemplary embodiment, $R_W$ is approximately 10 Ω at 25° C. and varies with temperature by about 0.4% per ° C., which is temperature coefficient for copper. Ideally, from a new temperature and frequency value one would calculate a new value for $R_W$ and then calculate a new phase shift φ(T) according to Equation (5). In order to simplify the calculations, it is desired to approximate the temperature and frequency components of this calculation separately. In the exemplary embodiment, Equation (5) is represented by piecewise linear approximations for both temperature and frequency compensation.

The temperature sensor 50 can also be used to improve the readability of the LCD display 30. The readability of the LCD display 30 is temperature-dependent. According to one embodiment of the invention, the LCD bias voltages are adapted or adjusted responsive to the temperature, as shown in FIG. 3.

Figure 4:
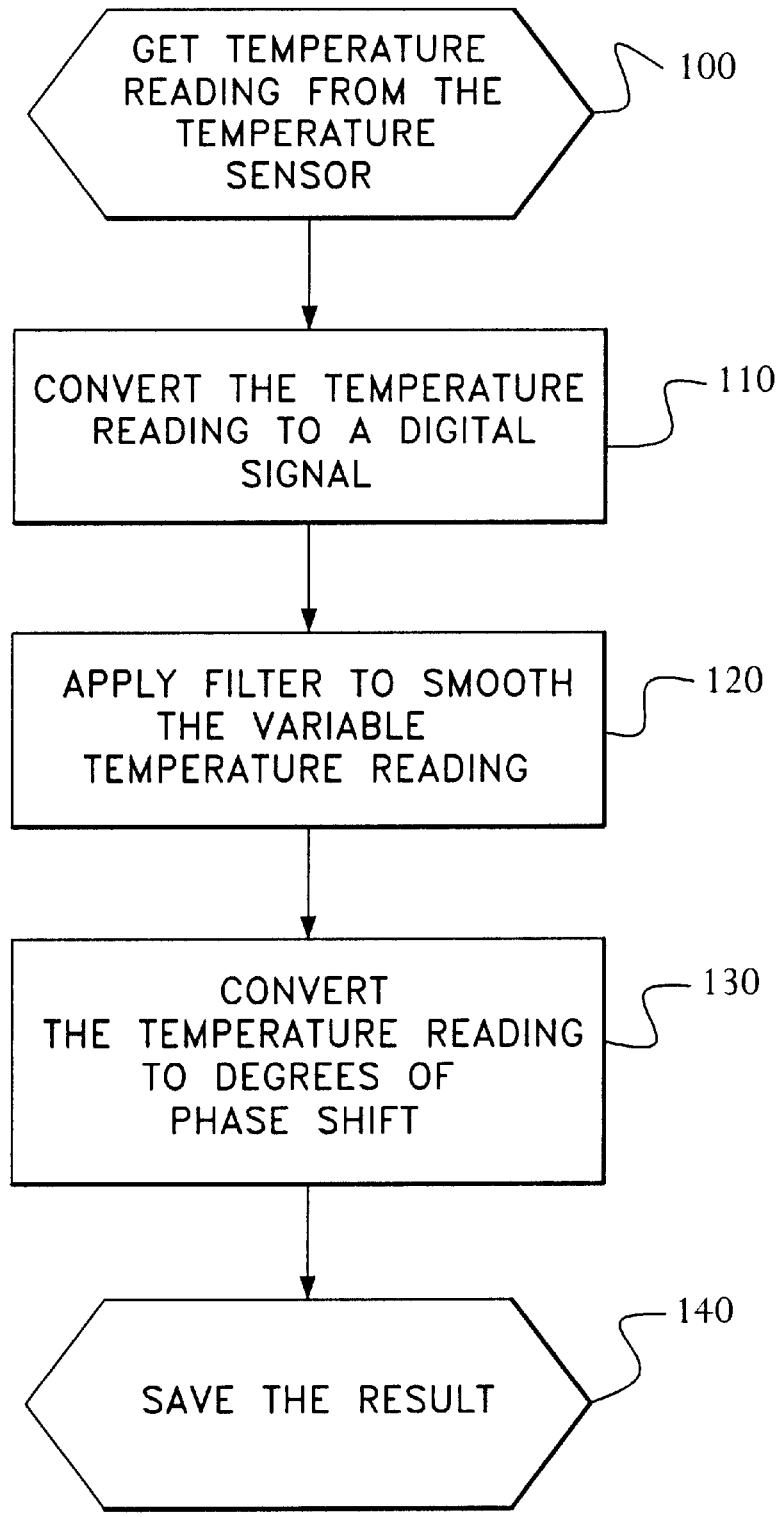
FIG. 4 is a flow chart of an exemplary temperature compensation method in accordance with the present invention.

FIG. 4 is a flow chart of an exemplary method of temperature compensation in accordance with the present invention. At step 100, the present temperature reading is obtained from the temperature sensor. At step 110, the temperature is converted by the A/D converter to obtain a digital signal.

If desired, and if additional or continuous temperature readings are being taken, the temperature (represented by a digital signal) can be filtered in order to reduce noise. The optional filtering is shown in step 120. An exemplary filter can be an infinite impulse response filter, for example, and is given by equation (6):

$$T_{avg,n}=[(m-1)/m]T_{avg,n-1}+(1/m)T_{instantaneous} \quad (6)$$

where $T_{avg,n-1}$ is the past filter output and $T_{avg,n}$ is the current filter output, $T_{instantaneous}$ is the presently obtained temperature reading, and m is the filter constant. It is noted that the first temperature reading is not filtered (because there is no average temperature reading yet).

The digital signal is then converted to degrees of phase shift at step 130 by solving a linear equation that has been found to be a close approximation of the temperature effect in Equation (5). For the exemplary embodiment, for example, the following linear Equation (7) is obtained:

$$\Phi(T)=\Phi_{0sensor}+m_{\Phi/T}(T-25° \text{ C.}) \quad (7)$$

$\Phi_{0sensor}$ is the phase shift of the specific current sensor being compensated at 25° C. (room temperature). This value is normally calibrated for each current sensor at the point of manufacture. For the exemplary embodiment $\Phi_{0sensor}$ is typically 6.18° and $m_{\Phi/T}$ is=0.012°/° C.

Figure 6:
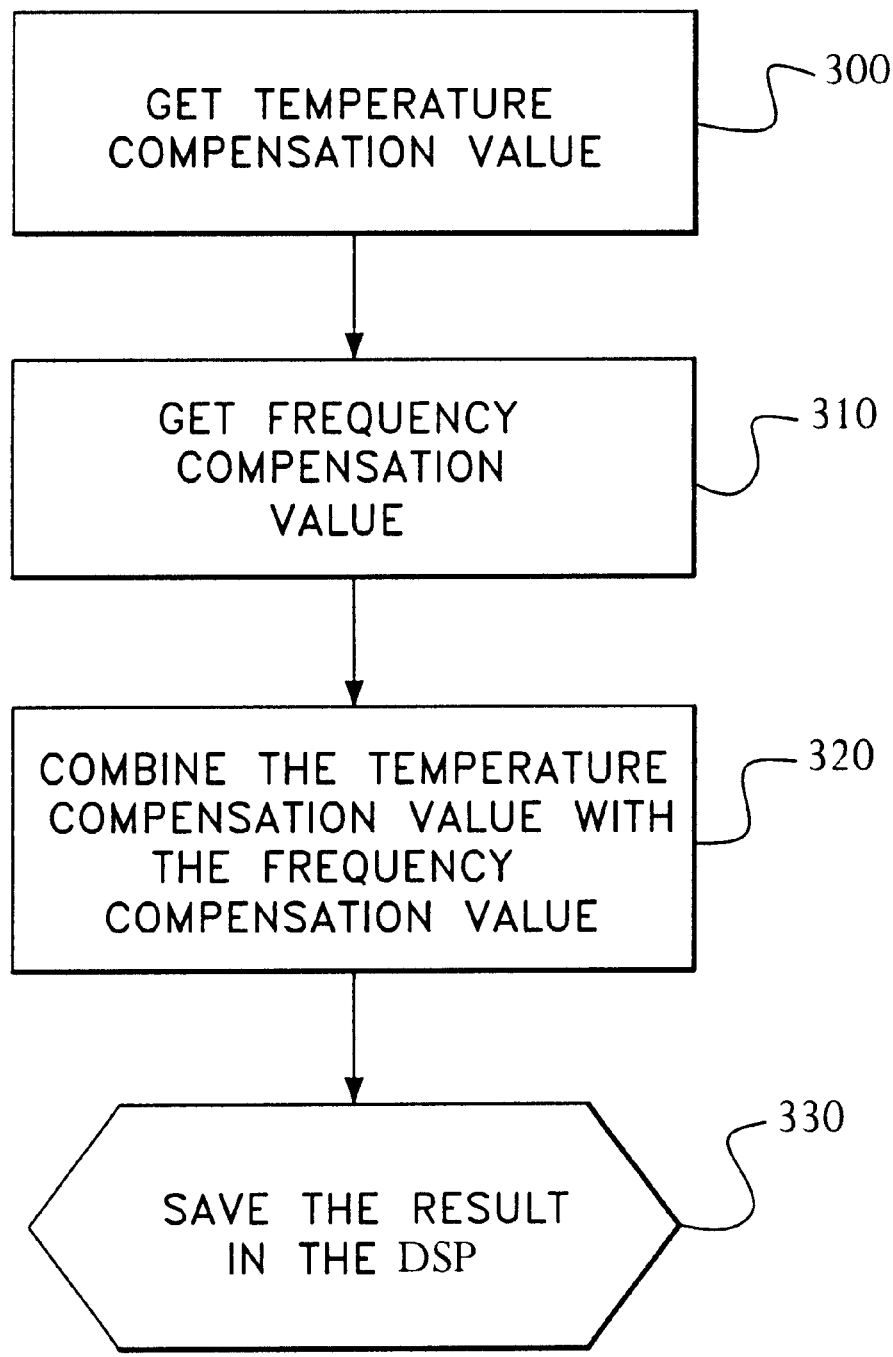
FIG. 6 is a flow chart of an exemplary method of combining the temperature compensation and the frequency compensation in accordance with the present invention.

At step 140, the calculated value Φ(T) is stored in the memory of microcontroller 16 and the value is provided to the DSP in the meter IC 14, for example by the exemplary procedure described with respect to FIG. 6. The microcontroller either uses this temperature-based phase shift compensation value alone or in conjunction with the below described frequency-based phase shift compensation value to compensate for the temperature and/or frequency induced phase shift(s) through calibration factors within the DSP.

As described above with respect to FIG. 1, the meter IC 14 monitors the voltage and current signals, and then computes frequency, among other things. Varying frequency induces varying amounts of phase shift error in the low permeability current sensors according to Equation (5). The present invention compensates for this frequency induced phase shift error.

Figure 5:
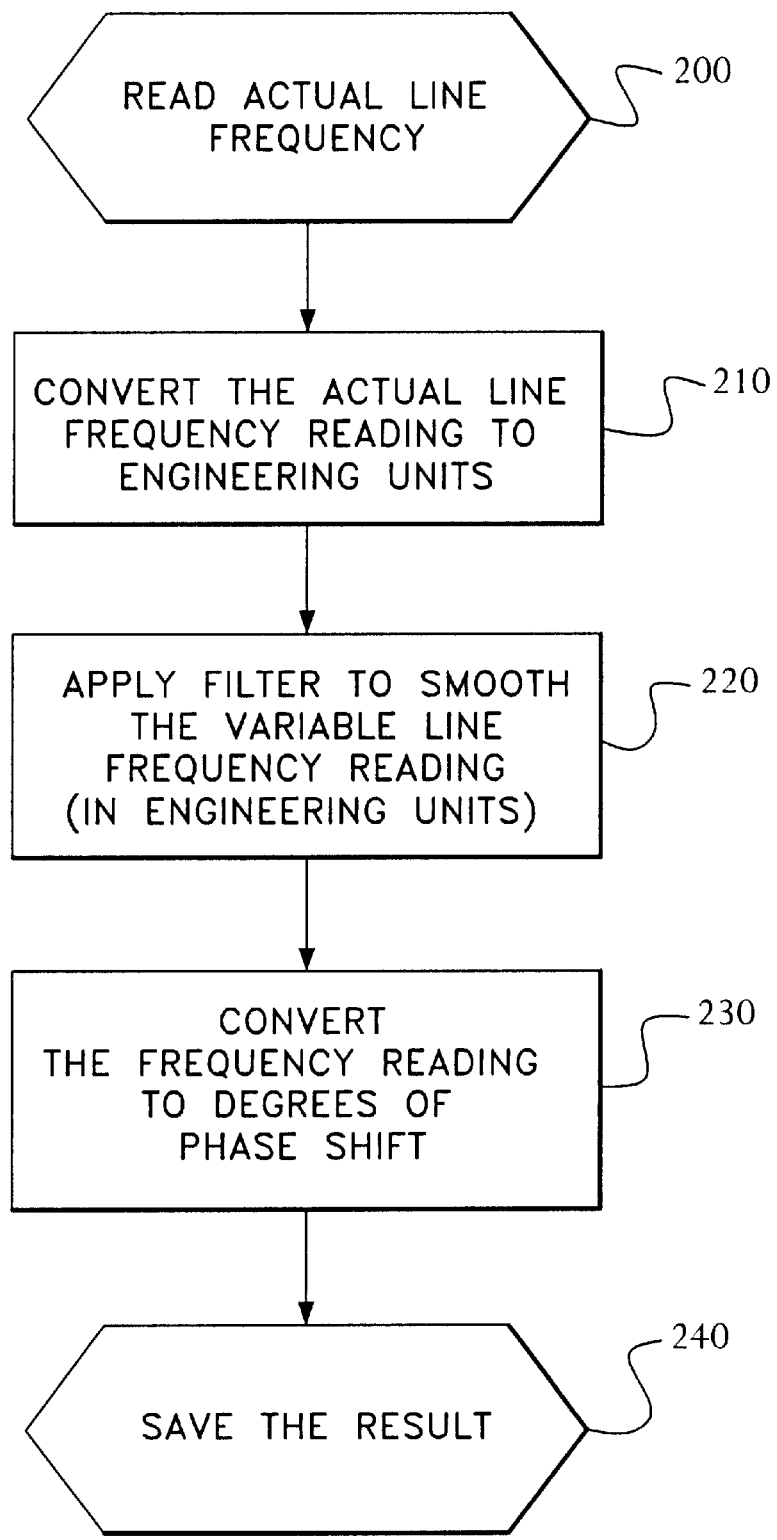
FIG. 5 is a flow chart of an exemplary frequency compensation method in accordance with the present invention.

FIG. 5 is a flowchart of an exemplary method of frequency compensation in accordance with the present invention. At step 200, the actual line frequency is measured in DSP units at a predetermined rate, with each value being stored in memory, such as the data RAM in meter IC 14. At step 210, the line frequency is read from the meter IC by the microcontroller and converted to a value in engineering units.

At step 220, the value in engineering units is smoothed using an IIR filter, for example, similar to the one described above with respect to the temperature compensation. In this case, the filter is given by equation (8):

$$f_{avg,n}=[(m-1)/m]f_{avg,n-1}+(1/m)f_{instantaneous} \quad (8)$$

where $f_{avg,n-1}$ is the past filter output and $f_{avg,n}$ is the current filter output, $f_{instantaneous}$ is the presently obtained frequency value, and m is the filter constant. It is noted that the first frequency reading is not filtered (because there is no average frequency reading yet).

The value in engineering units is then converted to degrees of phase shift at step 230 by solving a linear equation that has been determined from experimental data to be a good approximation for the effect of frequency in Equation (5). This is performed by measuring the phase shift of the current sensor at several different line frequencies to obtain a series of phase shift vs. line frequency curves for a 50 Hz system and/or a 60 Hz system. Using these curves and conventional mathematical techniques, a linear equation representing the phase shift for any line frequency can be determined. For example, the following linear equation (9) is obtained:

$$\Phi(f)=\Phi_{0sensor}+m_{\Phi/f}(f-f_{nominal} \text{ Hz}) \quad (9)$$

At 50 Hz, $m_{101\,/f}$=−0.126°/Hz. For 60 Hz, $m_{\Phi/f}$=−0.088°/Hz. Here again $\Phi_{0sensor}$ represents the actual phase shift of the individual current sensor at the nominal line frequency (and room temperature). At 50 Hz $\Phi_{0sensor}$ is nominally 6.18°, and at 60 Hz $\Phi_{0sensor}$ is nominally 5.15°. $\Phi_{0sensor}$ is normally calibrated for each current sensor at the point of manufacture. $f_{nominal}$ is either 50 Hz or 60 Hz, as appropriate.

The resulting value for $\Phi(f)$ is saved at step 240 in the memory of the microcontroller, and the value is provided to the DSP in the meter IC 14, for example by the exemplary procedure described with respect to FIG. 6. The resulting value of $\Phi(f)$ is the phase shift resulting from an off-nominal frequency.

FIG. 6 is a flowchart of an exemplary method of compensating for the phase shift errors in accordance with the present invention. The temperature compensation value is obtained (from the exemplary method of FIG. 4, for example) at step 300. At step 310, the frequency compensation value is obtained (from the exemplary method of FIG. 5, for example). At step 320, the temperature compensation value is combined with the frequency compensation value as shown in Equation (10):

$$\Phi(combined) = \Phi_{0sensor} + m_{\Phi/T}(T-25°\text{ C.}) + m_{\Phi/f}(f-f_{nominal}\text{ Hz}) \quad (10)$$

The result is written back to the DSP in the IC 14 at step 330. In other words, for each current sensor, a phase shift calibration value in the DSP's data memory is changed by the microcontroller to reflect the change in the compensation value. The DSP uses this phase shift calibration value in determining the output signals (including energy, instrumentation and potential indicator outputs) that the DSP provides to the microcontroller 16. Thus, if, for example, the phase shift is determined to be 5.5 degrees, then an offset of 5.5 degrees is provided to the DSP, and the DSP uses this offset (incorporates a 5.5 degree delay or a time shift based on the phase shift) in providing output values to the microcontroller 16.

The measured temperature and frequency values are applied for all current sensors. Because of the unit to unit variations in the initial phase shift $\Phi_{0sensor}$ for each current sensor, there is a unique $\Phi_{0sensor}$ and final phase calibration value for each current sensor.

It should be noted that the present invention can be used with any electronic meter and is not limited to the meter described herein.

While the invention has been described and illustrated with reference to specific embodiments, those skilled in the art will recognize that modification and variations may be made without departing from the principles of the invention as described hereinabove.

What is claimed is:

1. A method of compensating for temperature-induced phase shift in an energy meter, comprising:
    obtaining a temperature reading from a temperature sensor within the energy meter;
    converting the temperature reading to a digital signal;
    converting the digital signal to a degrees of phase shift value;
    providing the degrees of phase shift value to a processor in the energy meter; and
    adjusting the output of the processor responsive to the degrees of phase shift value.

2. The method according to claim 1, wherein converting the digital signal to the degrees of phase shift value comprises solving a linear equation for phase shift based on temperature.

3. The method according to claim 2, further comprising previously determining the linear equation from at least one of experimental data and product specifications.

4. The method according to claim 3, wherein the experimental data comprises a series of phase shift vs. temperature curves.

5. The method according to claim 1, wherein adjusting the output of the processor comprises delaying the output of the processor by an amount equal to the degrees of phase shift value.

6. The method according to claim 1, wherein adjusting the output of the processor comprises delaying the output of the processor by a time shift determined based on the degrees of phase shift value.

7. The method according to claim 1, further comprising filtering the digital signal prior to converting the digital signal to the degrees of phase shift value.

8. A method of compensating for frequency-induced phase shift in an energy meter, comprising:
    obtaining a line frequency reading from the energy meter;
    converting the line frequency reading to a value in engineering units;
    converting the value to a degrees of phase shift value;
    providing the degrees of phase shift value to a processor in the energy meter; and
    adjusting the output of the processor responsive to the degrees of phase shift value.

9. The method according to claim 8, wherein converting the value to the degrees of phase shift value comprises solving a linear equation for phase shift based on line frequency.

10. The method according to claim 9, further comprising previously determining the linear equation from at least one of experimental data and product specifications.

11. The method according to claim 10, wherein the experimental data comprises a series of phase shift vs. line frequency curves.

12. The method according to claim 8, wherein adjusting the output of the processor comprises delaying the output of the processor by an amount equal to the degrees of phase shift value.

13. The method according to claim 8, wherein adjusting the output of the processor comprises delaying the output of the processor by a time shift determined based on the degrees of phase shift value.

14. The method according to claim 8, further comprising filtering the value prior to converting the value to the degrees of phase shift value.

15. A method of compensating for temperature-induced phase shift and frequency-induced phase shift in an energy meter, comprising:
    obtaining a temperature reading from a temperature sensor within the energy meter;
    converting the temperature reading to a first digital signal;
    converting the first digital signal to a first degrees of phase shift value;
    providing the first degrees of phase shift value to a processor in the energy meter;
    obtaining a line frequency reading from the energy meter;
    converting the line frequency reading to a value in engineering units;
    converting the value in engineering units to a second degrees of phase shift value;
    providing the degrees of phase shift value to the processor in the energy meter; and adjusting the output of the processor responsive to the first degrees of phase shift value and the second degrees of phase shift value.

16. The method according to claim 15, wherein converting the first digital signal to the first degrees of phase shift value comprises solving a first linear equation for phase shift based on temperature, and converting the value in engineering units to the second degrees of phase shift value comprises solving a second linear equation for phase shift based on line frequency.

17. The method according to claim 16, further comprising previously determining the first and second linear equations from at least one of experimental data and product specifications.

18. The method according to claim 17, wherein the experimental data comprises a series of phase shift vs. temperature curves and a series of phase shift vs. line frequency curves.

19. The method according to claim 15, wherein adjusting the output of the processor comprises combining the first degrees of phase shift value and the second degrees of phase shift value to obtain a total degrees of phase shift value, and delaying the output of the processor by an amount equal to the total degrees of phase shift value.

20. The method according to claim 15, wherein adjusting the output of the processor comprises combining the first degrees of phase shift value and the second degrees of phase shift value to obtain a total degrees of phase shift value and delaying the output of the processor by a time shift determined based on the total degrees of phase shift value.

21. The method according to claim 15, further comprising filtering the first digital signal prior to converting the first digital signal to the first degrees of phase shift value, and filtering the value in engineering units prior to converting the value in engineering units to the second degrees of phase shift value.

22. A system for compensating for temperature-induced phase shift in an energy meter, comprising:
a temperature sensor for obtaining a temperature reading;
an analog to digital converter for receiving the temperature reading from the temperature sensor and converting the temperature reading to a digital signal;
a processor for receiving the digital signal from the converter and converting the digital signal to a degrees of phase shift value, the processor adjusting its output responsive to the degrees of phase shift value; and
a current transformer for sensing current provided to the energy meter, wherein the temperature sensor is disposed on the current transformer.

23. The system according to claim 22, wherein the current transformer comprises a core having a permeability below 10,000.

24. The system according to claim 22, further comprising a filter that filters the digital signal prior to the processor receiving the digital signal.

25. A system for compensating for line frequency-induced phase shift in an energy meter, comprising:
a processor for obtaining a line frequency reading; and
an analog to digital converter for receiving the line frequency reading from the processor and converting the line frequency reading to a value in engineering units,
wherein the processor receives the value in engineering units from the converter, converts the value in engineering units to a degrees of phase shift value, and adjusts its output responsive to the degrees of phase shift value.

26. The system according to claim 25, further comprising a filter that filters the value in engineering units prior to the processor receiving the digital signal.

27. A system for compensating for temperature-induced phase shift and frequency-induced phase shift in an energy meter, comprising:
a temperature sensor for obtaining a temperature reading;
a processor for obtaining a line frequency reading; and
an analog to digital converter for receiving the temperature reading from the temperature sensor and converting the temperature reading to a first digital signal, and for receiving the line frequency reading from the processor and converting the line frequency reading to a value in engineering units;
wherein the processor receives the first digital signal and the value in engineering units from the converter, converts the first digital signal and the value in engineering units to first and second degrees of phase shift values, and adjusts its output responsive to the first and second degrees of phase shift values.

28. The system according to claim 27, further comprising a current transformer for sensing current provided to the energy meter.

29. The system according to claim 28, wherein the current transformer comprises a core having a permeability below 10,000.

30. The system according to claim 28, wherein the temperature sensor is disposed on the current transformer.

31. The system according to claim 27, further comprising a filter that filters at least one of the first digital signal and the value in engineering units prior to the processor receiving the first digital signal and the value in engineering units.

32. An apparatus comprising a storage device that stores software that compensates for temperature-induced phase shift and frequency-induced phase shift in an energy meter and performs the acts of:
obtaining a temperature reading from a temperature sensor within the energy meter;
converting the temperature reading to a first digital signal;
converting the first digital signal to a first degrees of phase shift value;
obtaining a line frequency reading from the energy meter;
converting the line frequency reading to a value in engineering units;
converting the value in engineering units to a second degrees of phase shift value; and
adjusting the output of a processor in the energy meter responsive to the first degrees of phase shift value and the second degrees of phase shift value.

33. The apparatus according to claim 32, wherein the software performs converting the first digital signal to the first degrees of phase shift value by solving a first linear equation for phase shift based on temperature, and converting the value in engineering units to the second degrees of phase shift value by solving a second linear equation for phase shift based on line frequency.

34. The apparatus according to claim 32, wherein the software performs adjusting the output of the processor by combining the first degrees of phase shift value and the second degrees of phase shift value to obtain a total degrees of phase shift value, and delaying the output of the processor by an amount equal to the total degrees of phase shift value.

35. The apparatus according to claim 32, wherein the software performs adjusting the output of the processor by combining the first degrees of phase shift value and the second degrees of phase shift value to obtain a total degrees of phase shift value, and delaying the output of the processor by a time shift determined based on the total degrees of phase shift value.

36. The apparatus according to claim 33, wherein the software further performs filtering the first digital signal prior to converting the first digital signal to the first degrees of phase shift value, and filtering the value in engineering units prior to converting the value in engineering units to the second degrees of phase shift value.

* * * * *